(12) United States Patent
Oh et al.

(10) Patent No.: US 10,002,910 B2
(45) Date of Patent: Jun. 19, 2018

(54) ORGANIC LIGHT EMITTING DIODE DISPLAY DEVICE

(71) Applicant: LG Display Co., Ltd., Seoul (KR)

(72) Inventors: Young-Mu Oh, Seoul (KR);
Seung-Han Paek, Bucheon-si (KR);
Hyo-Dae Bae, Daegu (KR);
Jeong-Won Lee, Goyang-si (KR);
Heon-Il Song Song, Paju-si (KR);
Jong-Hoon Yeo, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/341,821

(22) Filed: Nov. 2, 2016

(65) Prior Publication Data

US 2017/0125496 A1    May 4, 2017

(30) Foreign Application Priority Data

Nov. 3, 2015 (KR) .......................... 10-2015-0154130

(51) Int. Cl.
*H01L 27/15* (2006.01)
*H01L 51/56* (2006.01)
*H01L 51/52* (2006.01)
*H01L 27/32* (2006.01)
*H01L 51/50* (2006.01)

(52) U.S. Cl.
CPC ...... *H01L 27/3211* (2013.01); *H01L 27/3218* (2013.01); *H01L 51/5056* (2013.01); *H01L 51/5088* (2013.01); *H01L 51/5265* (2013.01); *H01L 2251/558* (2013.01)

(58) Field of Classification Search
CPC ............. H01L 27/3211; H01L 27/3218; H01L 27/3262; H01L 51/5056; H01L 51/5088; H01L 51/5265
USPC ........ 257/40, 43, 57, 59, 72, 79, 88, 89, 98, 257/E51.018, E51.022, E33.053, E33.061, 257/E21.111, E27.119, E21.002, E21.09; 315/504, 506, 507; 438/29, 34, 35, 46
See application file for complete search history.

(56) References Cited

U.S. PATENT DOCUMENTS 8,766,282 B2 * 7/2014 Noh .................... H01L 27/3211
257/79
9,627,649 B2 * 4/2017 Baek, II .............. H01L 27/3213
2004/0207583 A1 10/2004 Koo et al.
(Continued)

FOREIGN PATENT DOCUMENTS

CN         1538361 A    10/2004
TW     200746878 A    12/2007
(Continued)

*Primary Examiner* — Dao H Nguyen
(74) *Attorney, Agent, or Firm* — Birch, Stewart, Kolasch & Birch, LLP

(57) ABSTRACT

An organic light emitting diode display device according to an embodiment includes a substrate having first and second pixel regions and a driving region between the first and second pixel regions; first electrodes disposed in the first and second pixel regions, respectively, on the substrate, the first electrodes being spaced apart from each other; a driving unit in the driving region; first and second organic layers on the first electrodes disposed in the first and second pixel regions, respectively, the first and second organic layer having a different thickness from each other; and a second electrode on the first and second organic layers.

20 Claims, 7 Drawing Sheets

(56) References Cited

U.S. PATENT DOCUMENTS

| | | | |
|---|---|---|---|
| 2006/0114190 A1* | 6/2006 | Fang | G09G 3/3233 345/76 |
| 2008/0143649 A1 | 6/2008 | Asaki et al. | |
| 2009/0256168 A1 | 10/2009 | Taneda et al. | |
| 2011/0186820 A1* | 8/2011 | Kim | C23C 14/044 257/40 |
| 2014/0131674 A1* | 5/2014 | Park | H01L 27/3209 257/40 |
| 2014/0183479 A1* | 7/2014 | Park | H01L 51/56 257/40 |
| 2014/0312333 A1* | 10/2014 | Chaji | H01L 51/50 257/40 |
| 2017/0125725 A1* | 5/2017 | Paek | H01L 27/3246 |

FOREIGN PATENT DOCUMENTS

| | | |
|---|---|---|
| TW | 201002143 A1 | 1/2010 |
| TW | 201442217 A | 11/2014 |

\* cited by examiner

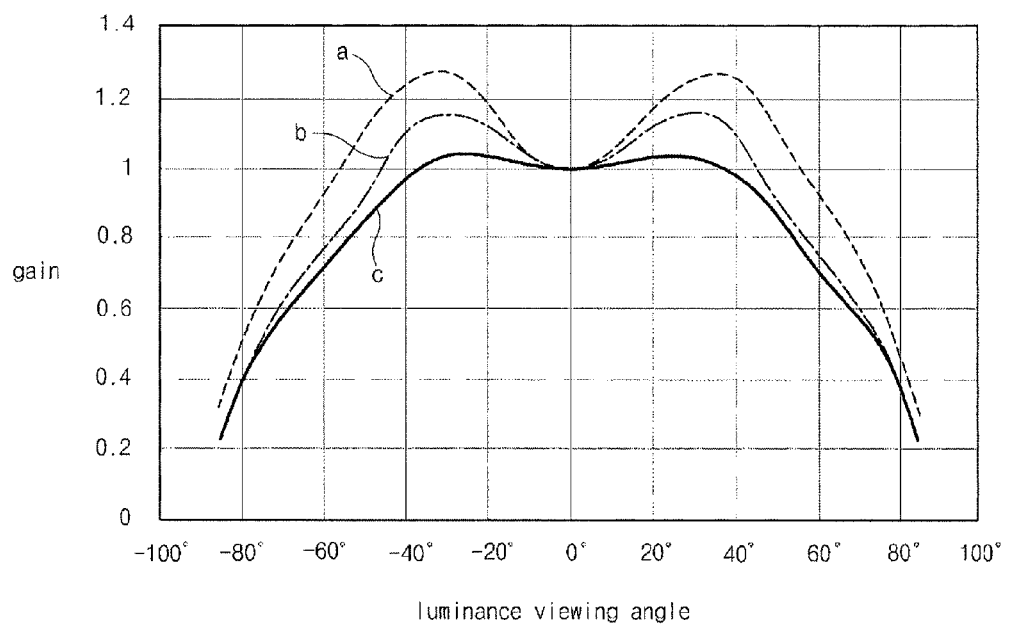

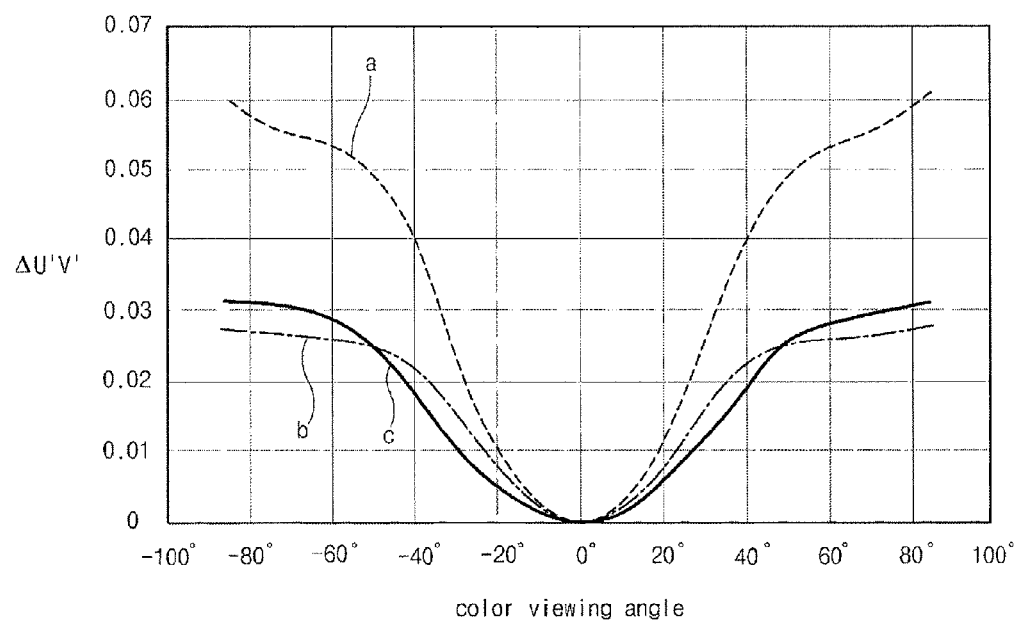

ORGANIC LIGHT EMITTING DIODE DISPLAY DEVICE

CROSS-REFERENCE TO RELATED APPLICATIONS

This application claims priority from and the benefit under 35 U.S.C. § 119(a) of Korean Patent Application No. 10-2015-0154130, filed on Nov. 3, 2015, in the Korean Intellectual Property Office, which is hereby incorporated by reference in its entirety.

BACKGROUND

1. Field of the Invention

The present disclosure relates to an organic light emitting diode display device, and more particularly, to an organic light emitting diode display device where the emission efficiency and the viewing angle are improved.

2. Discussion of the Related Art

Recently, various flat panel displays (FPDs) such as liquid crystal display (LCD) devices, plasma display panel (PDP) devices, organic light emitting diode (OLED) display devices and field emission display (FED) devices have been widely researched and used.

Among various FPDs, since the OLED display device of an emissive device does not require an additional light source such as a backlight unit for the LCD device, the OLED display device has a light weight and a thin profile. As compared with the LCD device, the OLED display device has superior properties in a viewing angle, a contrast ratio and a power consumption. In addition, the OLED display device can be driven by a direct current (DC) low voltage and has a high response speed. Since internal components of the OLED display device are solid, the OLED display device is resistant to external shocks and has a wide available temperature range. Specifically, since the manufacturing process for the OLED display device is simple, a production cost for the OLED display device can be reduced as compared with the LCD device.

FIG. 1 is a plan view showing an organic light emitting diode display device according to the related art, and FIG. 2 is a cross-sectional view taken along a line II-II of FIG. 1.

In FIG. 1, an organic light emitting diode (OLED) display device 10 according to the related art includes a substrate 11 having a pixel region PA and a driving region DA below the pixel region PA, a first electrode 15 in the pixel region PA on the substrate 11, an auxiliary electrode 14 in the driving region DA on the substrate 11 and a bank layer 17 surrounding the pixel region PA and the driving region DA. The pixel region PA includes first to third sub-pixels SP1 to SP3. The first, second and third sub-pixels SP1, SP2 and SP3 display red, green and blue colors, respectively, and constitute a unit pixel.

Although not shown, a driving unit for driving the first to third sub-pixels SP1 to SP3 is formed in the driving region DA. The driving unit includes at least one thin film transistor (TFT) and is formed under the auxiliary electrode 14 to be connected to the first electrode 15.

In FIG. 2, the first electrode 15 is formed in the pixel region PA on the substrate 11, and the auxiliary electrode 14 is formed in the driving region DA on the substrate 11 to be spaced apart from the first electrode 15.

The bank layer 17 is formed on the auxiliary electrode 14 and the first electrode 15 to cover an edge portion of the first electrode 15 and has an opening 40 to expose the auxiliary electrode 14.

An organic layer 20 is formed on the first electrode 15, and a second electrode 25 is formed on the organic layer 20. The second electrode 25 is formed on the entire surface of the substrate 11 having the organic layer 20 and is connected to the auxiliary electrode 14 through the opening 40. Here, the first and second electrodes 15 and 25 and the organic layer between the first and second electrodes 15 and 25 constitute a light emitting diode E.

FIG. 3 is a cross-sectional view showing first to third sub-pixels of a pixel region of an organic light emitting diode display device according to the related art. In FIG. 3, each of first to third sub-pixels SP1 to SP3 of an organic light emitting diode (OLED) display device 10 according to the related art includes first and second electrodes 15 and 25 facing each other and an organic layer 20 disposed between the first and second electrodes 15 and 25.

The organic layer 20 includes a hole injecting layer HIL on the first electrode 15, a hole transporting layer HTL on the hole injecting layer HIL, one of red, green and blue emitting material layers EML(R), EML(G) and EML(B) on the hole transporting layer HTL, an electron transporting layer ETL on the one of red, green and blue emitting material layers EML(R), EML(G) and EML(B).

The first electrode 15 as a reflective electrode has a triple-layered structure including two transparent conductive material layers ITO and a reflective layer REF between the two transparent conductive material layers ITO. The second electrode 25 as a transflective electrode transmits a portion of a light generated by the organic layer 20 and reflects the other portion of the light generated by the organic layer 20.

The light reflected by the second electrode 25 is reflected again by the first electrode 15, and when the lights reflected by the first and second electrodes 15 and 25 have the same wavelength as each other, they give rise to constructive interference called a microcavity. As a result, a luminance property and an emission efficiency of the OLED display device 10 are improved.

To generate such a microcavity, the organic layer 20 may have different thicknesses in the first to third sub-pixels SP1 to SP3 based on an optical distance that can generate the microcavity. For example, the hole injecting layer HIL or the hole transporting layer HTL under the red, green and blue emitting material layers EML(R), EML(G) and EML(B) may be sequentially reduced.

At this time, the hole injecting layer HIL or the hole transporting layer HTL is formed of a relatively thick thickness to satisfy the optical distance for the microcavity. Accordingly, a problem occurs that the emission efficiency is reduced with an increase in the thickness of the hole injecting layer HIL or the hole transporting layer HTL.

In addition, although a luminance along a front direction is improved, a luminance viewing angle and a chrominance property are deteriorated as the conventional organic light emitting diode display device has a microcavity structure.

Meanwhile, the luminance viewing angle and the chrominance property may be improved by placing a color filter layer on the light emitting diode E. However, since the number of fabrication steps and the material cost increase due to the color filter layer, there is a problem that the manufacturing cost increases.

SUMMARY

Embodiments of the present disclosure relate to an organic light emitting diode display device that substantially obviates one or more of the problems due to limitations and disadvantages of the related art.

One embodiment is an organic light emitting diode display device where the emission efficiency and the viewing angle are improved. Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment provides an organic light emitting diode display device includes a substrate having first and second pixel regions and a driving region between the first and second pixel regions; first electrodes disposed in the first and second pixel regions, respectively, on the substrate, the first electrodes being spaced apart from each other; a driving unit in the driving region; first and second organic layers on the first electrodes disposed in the first and second pixel regions, respectively, the first and second organic layer having a different thickness from each other; and a second electrode on the first and second organic layers.

In another aspect, the present invention provides a method of forming an organic light emitting diode display device. The method includes providing a substrate having first and second pixel regions and a driving region between the first and second pixel regions, and forming first electrodes in the first and second pixel regions and an auxiliary electrode in the driving region, respectively. The method further includes forming a driving unit in the driving region, forming first and second organic layers on the first electrodes disposed in the first and second pixel regions, respectively, the first and second organic layer having a different thickness from each other, and forming a second electrode on the first and second organic layers, wherein the first electrode and the auxiliary electrode are spaced apart and the second electrode is connected to the auxiliary electrode.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

FIGS. 10A and 10B are graphs showing a luminance viewing angle property and a color viewing angle property, respectively, of an organic light emitting diode display device according to the first and second embodiments of the present disclosure.

DETAILED DESCRIPTION OF THE EMBODIMENTS

Figure 1:
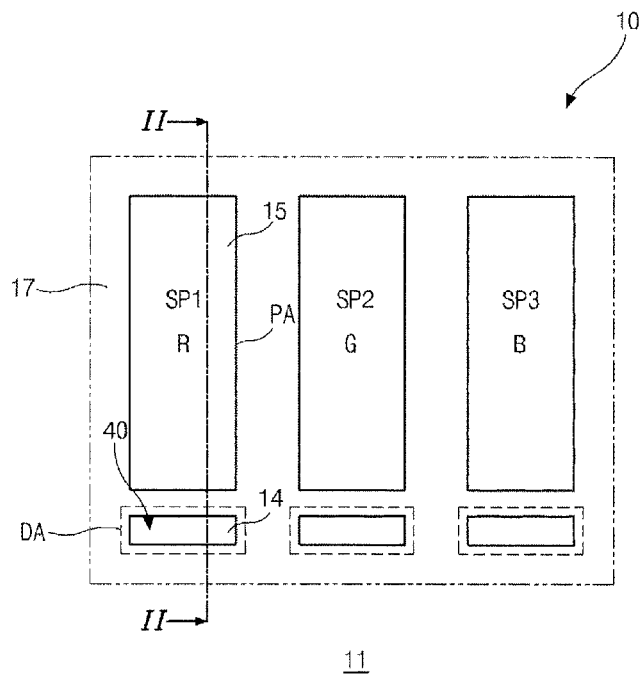
FIG. 1 is a plan view showing an organic light emitting diode display device according to the related art.
Figure 2:
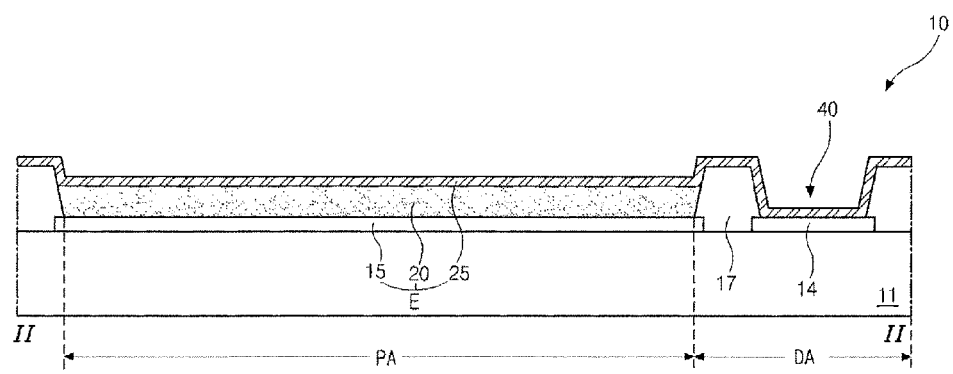
FIG. 2 is a cross-sectional view taken along a line II-II of FIG. 1.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products. Words of 'on' and 'under' are used only for describing a direction in the following explanations and thus are not limited to 'directly on' and 'directly under.'

Figure 4:
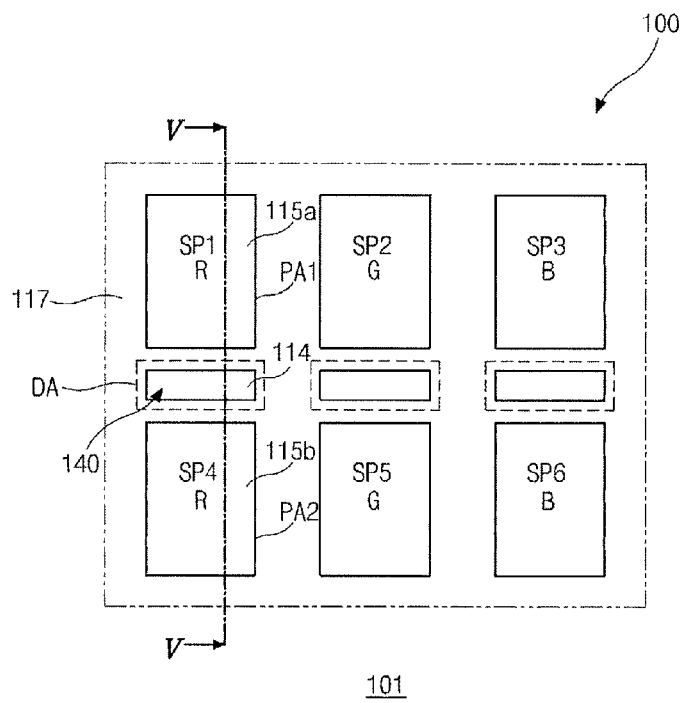
FIG. 4 is a plan view showing an organic light emitting diode display device according to a first embodiment of the present disclosure.
Figure 5:
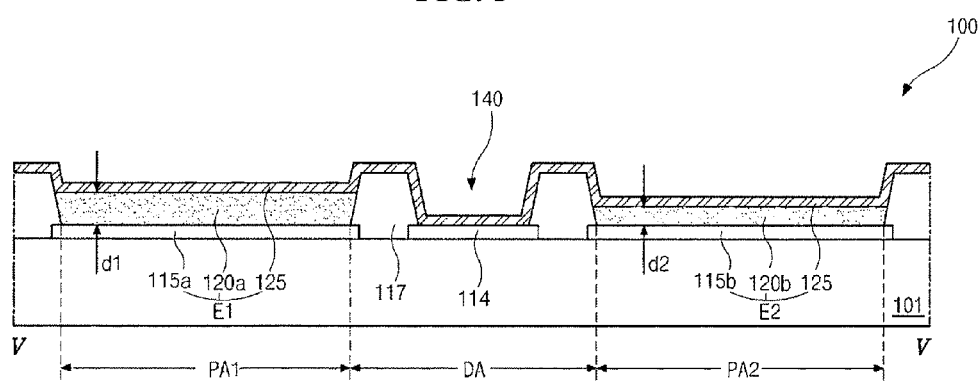
FIG. 5 is a cross-sectional view taken along a line V-V of FIG. 4.

FIG. 4 is a plan view showing an organic light emitting diode display device according to a first embodiment of the present disclosure, and FIG. 5 is a cross-sectional view taken along a line V-V of FIG. 4.

In FIG. 4, an organic light emitting diode (OLED) display device 100 of a top emission type according to a first embodiment of the present disclosure includes a substrate 101 having first and second pixel regions PA1 and PA2, a driving region DA between the first and second pixel regions PA1 and PA2, first electrodes 115a and 115b disposed in the first and second pixel regions PA1 and PA2 respectively on the substrate 101, an auxiliary electrode 114 disposed in the driving region DA on the substrate 101, and a bank layer 117 surrounding the first and second pixel regions PA1 and PA2 and the driving region DA.

The first pixel region PA1 includes first to third sub-pixels SP1 to SP3, and the second pixel region PA2 includes fourth to sixth sub-pixels SP4 to SP6. The first, second and third sub-pixels SP1, SP2 and SP3 display red, green and blue colors, respectively, and the fourth, fifth and sixth sub-pixels SP4, SP5 and SP6 display red, green and blue colors, respectively. The first to sixth sub-pixels SP1 to SP6 may constitute a unit pixel for displaying a white color.

The first and second pixel regions PA1 and PA2 may have the different area from each other or may have the same area as each other. For example, the first and second pixel regions PA1 and PA2 may have a square shape of an equal area.

A driving unit 150 (of FIG. 7) for driving the first to sixth sub-pixels SP1 to SP6 is formed in the driving region DA. The first sub-pixel SP1 of the first pixel region PA1 and the fourth sub-pixel SP4 of the second pixel region PA2 are driven according to the same data signal by the driving unit 150, the second sub-pixel SP2 of the first pixel region PA1 and the fifth sub-pixel SP5 of the second pixel region PA2 are driven according to the same data signal by the driving unit 150, and the third sub-pixel SP3 of the first pixel region PA1 and the sixth sub-pixel SP6 of the second pixel region PA2 are driven according to the same data signal by the driving unit 150.

In FIG. 5, the first electrodes 115a and 115b are formed in the first and second pixel regions PA1 and PA2, respectively, on the substrate 101, and the auxiliary electrode 114 is formed in the driving region DA on the substrate 101 to be spaced apart from the first electrodes 115a and 115b.

The bank layer 117 is formed on the first electrodes 115a and 115b and the auxiliary electrode 114 to cover an edge portion of the first electrodes 115a and 115b and has an opening 140 exposing the auxiliary electrode 114.

First and second organic layers 120a and 120b are formed on the first electrodes 115a and 115b in the first and second pixel regions PA1 and PA2, respectively, and a second electrode 125 is formed on the first and second organic layers 120a and 120b. The first and second organic layers 120a and 120b have first and second thicknesses d1 and d2, respectively, different from each other. In addition, the second electrode 125 is formed on the entire surface of the substrate 101 having the first and second organic layers 120a and 120b and is connected to the auxiliary electrode 114 through the opening 140.

Meanwhile, the OLED display device 100 of the first embodiment of the present invention is a top emission type, and a light of the first and second organic layers 120a and 120b is emitted through the second electrode 125. Because the second electrode 125 is made of an opaque metallic material, the second electrode 125 is to be formed to have a relatively thin thickness to maintain transmittancy.

However, when the second electrode 125 is formed with a relatively thin thickness to maintain transmittancy, a sheet resistance of the second electrode 125 may increase relatively and the difference in a location-specific voltage drop across the second electrode 125 may increase. As a result, non-uniformity in luminance may increase.

Accordingly, in the OLED display device 100 according to the first embodiment of the present invention, the sheet resistance of the second electrode 125 is reduced and the non-uniformity in luminance is prevented by forming the auxiliary electrode 114 connected to the second electrode 125 in the driving region DA.

The first and second electrodes 115a and 125 and the first organic layer 120a disposed between the first and second electrode 115a and 125 in the first pixel region PA1 constitute a first light emitting diode E1, and the first and second electrodes 115b and 125 and the second organic layer 120b disposed between the first and second electrode 115b and 125 in the second pixel region PA2 constitute a second light emitting diode E2.

Referring to FIG. 5, the driving unit 150 (of FIG. 7) is formed under the bank layer 117 and the auxiliary electrode 114 in the driving region DA and is connected to the first electrodes 115a and 115b in the first and second pixel regions PA1 and PA2, respectively.

Figure 6:
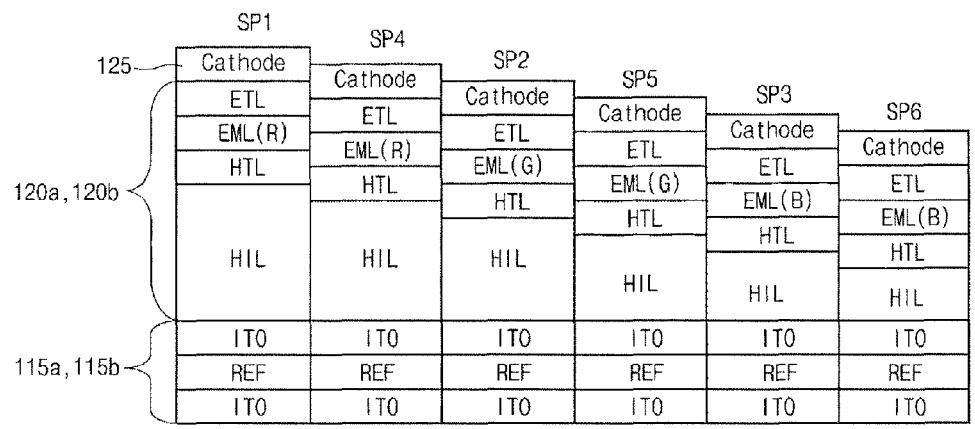
FIG. 6 is a cross-sectional view showing first to third sub-pixels of a pixel region of an organic light emitting diode display device according to the first embodiment of the present disclosure.

FIG. 6 is a cross-sectional view showing first to sixth sub-pixels of a pixel region of an organic light emitting diode display device according to a first embodiment of the present disclosure.

In FIG. 6, each of first to third sub-pixels SP1 to SP3 of an organic light emitting diode (OLED) display device 100 includes first and second electrodes 115a and 125 facing each other and a first organic layer 120a disposed between the first and second electrodes 115a and 125, and each of fourth to sixth sub-pixels SP4 to SP6 of the OLED display device 100 includes first and second electrodes 115b and 125 facing each other and a second organic layer 120b disposed between the first and second electrodes 115b and 125.

Specifically, each of the first and second organic layers 120a and 120b includes a hole injecting layer HIL on the first electrodes 115a and 115b, a hole transporting layer HTL on the hole injecting layer HIL, red, green and blue emitting material layers EML(R), EML(G) and EML(B) on the hole transporting layer HTL, an electron transporting layer ETL on the red, green and blue emitting material layers EML(R), EML(G) and EML(B). The hole injecting layer HIL and the hole transporting layer HTL may be referred to as a hole auxiliary layer.

The first and second organic layers 120a and 120b may be formed through a deposition process or a soluble process including an inkjet printing and a nozzle printing. Especially, when the first and second organic layers 120a and 120b are formed through the soluble process, an organic material solution is dropped on the first electrodes 115a and 115b in the first and second pixel regions PA1 and PA2. The dropped organic material solution may be spread out evenly throughout each of the first and second pixel regions PA1 and PA2 by forming the first and second pixel regions PA1 and PA2 as a square shape of an equal area, thereby improving the thickness uniformity of the first and second organic layers 120a and 120b.

Each of the first electrodes 115a and 115b as a reflective electrode has a triple-layered structure including two transparent conductive material layers ITO and a reflective layer REF between the two transparent conductive material layers ITO. The second electrode 125 as a transflective electrode transmits a portion of a light generated by the first and second organic layers 120a and 120b and reflects the other portion of the light generated by the first and second organic layers 120a and 120b.

The light reflected by the second electrode 125 is reflected again by the first electrodes 115a and 115b, and the lights reflected by the first and second electrodes 115a, 115b and 125 with the same wavelength give rise to constructive interference (hereinafter referred to as microcavity). As a result, an emission efficiency of the first and second light emitting diodes E1 and E2 is improved.

To generate such a microcavity, the first organic layer 120a is formed to have different thicknesses in the first to third sub-pixels SP1 to SP3 as an optical distance to produce the microcavity, and the second organic layer 120b is formed to have different thicknesses in the fourth to sixth sub-pixels SP4 to SP6 as an optical distance to produce the microcavity. For example, a thickness of the hole auxiliary layer between the first electrode 115a or 115b and the red, green and blue emitting material layers EML(R), EML(G) and EML(B) may be sequentially reduced. Accordingly, a thickness of the hole injecting layers HIL or the hole transporting layers HTL under the red, green and blue emitting material layers EML(R), EML(G) and EML(B) may be sequentially reduced.

In the first embodiment of the present disclosure, the first electrodes 115a have different thickness in the first to third sub-pixels SP1 to SP3 as an optical distance to generate the microcavity, and the first electrodes 115b have different thicknesses in the fourth to sixth sub-pixels SP4 to SP6 as an optical distance to generate the microcavity. For example, a thickness of the upper transparent conductive material layer ITO of the first electrodes 115a and 115b on the reflective layer REF may be sequentially reduced.

Specifically, in the OLED display device 100 according to the first embodiment of the present disclosure, the first thickness d1 (of FIG. 5) of the first organic layer 120a in the first to third sub-pixels SP1 to SP3 is different from the second thickness d2 (of FIG. 5) of the second organic layer 120b in the fourth to sixth sub-pixels SP4 to SP6.

Figure 3:
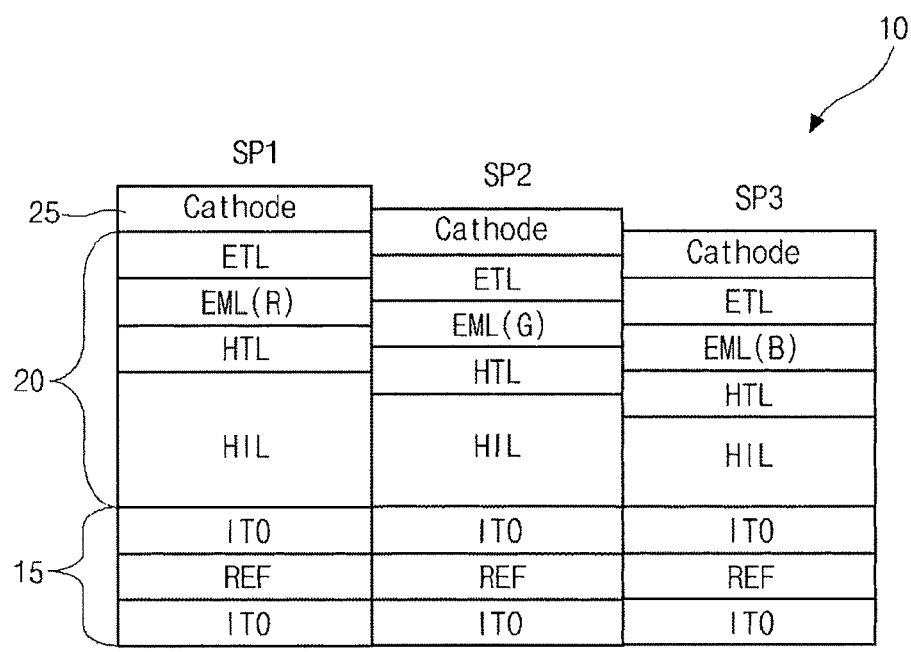
FIG. 3 is a cross-sectional view showing first to third sub-pixels of a pixel region of an organic light emitting diode display device according to the related art.

For example, one of the first and second organic layers 120a and 120b may have a thickness corresponding to the thickness of the organic layer 20 (of FIG. 3) of the related art, and the other of the first and second organic layers 120a and 120b may have a thickness smaller than the thickness of the organic layer 20 (of FIG. 3) of the related art.

Further, the first thickness d1 of the first organic layer 120a of the first sub-pixel SP1 may be greater than the second thickness d2 of the second organic layer 120b of the fourth sub-pixel SP4, and the second thickness d2 of the second organic layer 120b of the fourth sub-pixel SP4 may be greater than the first thickness d1 of the first organic layer 120a of the second sub-pixel SP2. The first thickness d1 of the first organic layer 120a of the second sub-pixel SP2 may be greater than the second thickness d2 of the second organic layer 120b of the fifth sub-pixel SP5, and the second thickness d2 of the second organic layer 120b of the fifth sub-pixel SP5 may be greater than the first thickness d1 of the first organic layer 120a of the third sub-pixel SP3. The first thickness d1 of the first organic layer 120a of the third sub-pixel SP3 may be greater than the second thickness d2 of the second organic layer 120b of the sixth sub-pixel SP6.

In addition, one of the first and second organic layers 120a and 120b may include the hole injecting layers HIL or the hole transporting layers HTL having a thickness based on a luminance of the first and second light emitting diodes E1 and E2, and the other of the first and second organic layers 120a and 120b may include the hole injecting layers HIL or the hole transporting layers HTL having a thickness based on a luminance or a color viewing angle of the first and second light emitting diodes E1 and E2.

For example, the first light emitting diode E1 may have a luminance property superior to the second light emitting diode E2 such that a luminance along a front direction of the first light emitting diode E1 is greater than a luminance along a front direction of the second light emitting diode E2, and the second light emitting diode E2 may have a luminance viewing angle property superior to the first light emitting diode E1 such that a difference in a luminance or a color difference between front and diagonal directions of the second light emitting diode E2 is smaller than a difference in a luminance or a color difference between front and diagonal directions of the first light emitting diode E1.

In the OLED display device 100 of the first embodiment of the present disclosure, since the first and second organic layers 120a and 120b have a structure for the microcavity, an optical property such as a luminance is improved.

In addition, since a thickness of the hole injecting layer HIL or the hole transporting layer HTL of one of the first and second organic layers 120a and 120b is reduced as compared with the OLED display device 10 (of FIG. 3) according to the related art, a current efficiency (a ratio of an output luminance to an input current: cd/A), a luminance viewing angle property and a color difference (chrominance) property are improved. Further, since a color filter layer for improving the luminance viewing angle is omitted, a fabrication cost is reduced.

Figure 7:
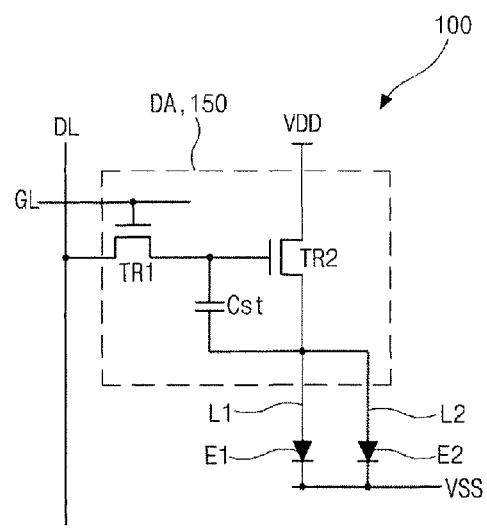
FIG. 7 is a view showing a driving unit of an organic light emitting diode display device according to the first embodiment of the present disclosure.

FIG. 7 is a view showing a driving unit of an organic light emitting diode display device according to the first embodiment of the present disclosure.

In FIG. 7, a driving unit 150 of an organic light emitting diode (OLED) display device 100 according to the first embodiment of the present disclosure includes a switching thin film transistor (TFT) TR1, a driving TFT TR2 and a capacitor Cst. The switching TFT TR1 is connected between the driving TFT TR2 and a data line DL and is turned on according to a scan pulse supplied through a gate line GL. The driving TFT TR2 is connected between a high level voltage VDD and a low level voltage VSS and drives first and second light emitting diodes E1 and E2. The capacitor Cst is connected to a node between the switching TFT TR1 and the driving TFT TR2 and is connected to the first and second light emitting diodes E1 and E2.

The driving unit 150 may include a plurality of TFTs to compensate deterioration of the driving TFT TR2 and the first and second light emitting diodes E1 and E2.

Since the first and second light emitting diodes E1 and E2 are driven by the single driving unit 150 in a driving region DA between first and second pixel regions PA1 and PA2 (of FIG. 4), first electrodes 115a and 115b (of FIG. 4) of the first and second light emitting diodes E1 and E2 in first and second pixel regions PA1 and PA2 (of FIG. 4) are connected to the single driving unit 150 through first and second driving lines L1 and L2, respectively.

In addition, because the thicknesses of the first and second organic layers 120a and 120b on the first electrodes 115a and 115b in the first and second pixel regions PA1 and PA2 are different from each other, the first and second driving lines L1 and L2 may have different lengths or different widths from each other. For example, when a first thickness d1 (of FIG. 5) of the first organic layer 120a is greater than a second thickness d2 (of FIG. 5) of the second organic layer 120b (d1>d2), a length of the first driving line L1 may be smaller than a length of the second driving line L2 or a width of the first driving line L1 may be greater than a width of the second driving line L2 so that a current applied to the first electrode 115a connected to the first driving line L1 can be greater than a current applied to the first electrode 115b connected to the second driving line L2.

Meanwhile, in another embodiment, two driving units driving the first and second light emitting diodes E1 and E2, respectively, may be formed in the driving area DA between the first and second pixel regions PA1 and PA2. One of the two driving units may be connected to the first electrode of the first light emitting diode E1 through a first driving line and the other of the two driving unit may be connected to the first electrode of the second light emitting diode E2 through a second driving line. The first and second driving lines may have different lengths or different widths from each other. In the OLED display device of a top emission type, the aperture ratio is not reduced even when the two driving units are formed in the driving region DA.

Figure 8:
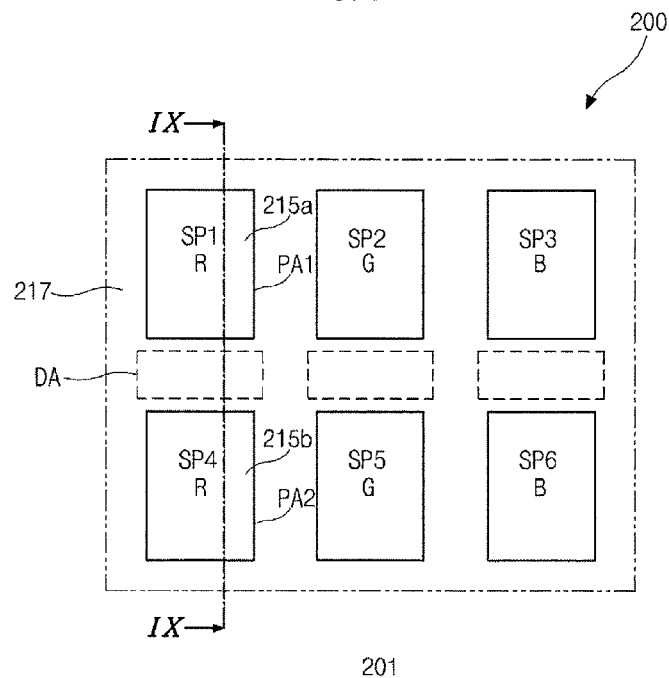
FIG. 8 is a plan view showing an organic light emitting diode display device according to a second embodiment of the present disclosure.
Figure 9:
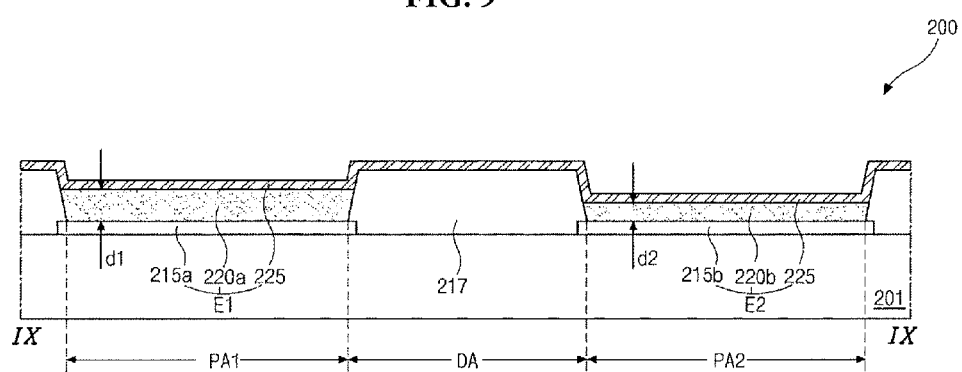
FIG. 9 is a cross-sectional view taken along a line IX-IX of FIG. 8.

FIG. 8 is a plan view showing an organic light emitting diode display device according to a second embodiment of the present disclosure, and FIG. 9 is a cross-sectional view taken along a line IX-IX of FIG. 8. Since an OLED display device according to the second embodiment has a similar structure to the OLED display device according to the first embodiment, detailed descriptions on the same part may be omitted or will be brief.

In FIG. 8, an organic light emitting diode (OLED) display device 200 of a bottom emission type according to a second embodiment of the present disclosure includes a substrate 201 having first and second pixel regions PA1 and PA2, a driving region DA between the first and second pixel regions PA1 and PA2, first electrodes 215a and 215b in the first and second pixel regions PA1 and PA2 on the substrate 201, and a bank layer 217 surrounding the first and second pixel regions PA1 and PA2. The first pixel region PA1 includes first to third sub-pixels SP1 to SP3, and the second pixel region PA2 includes fourth to sixth sub-pixels SP4 to SP6. The first, second and third sub-pixels SP1, SP2 and SP3 display red, green and blue colors, respectively, and the fourth, fifth and sixth sub-pixels SP4, SP5 and SP6 display red, green and blue colors, respectively. The first to sixth sub-pixels SP1 to SP6 may constitute a unit pixel for displaying a white color.

The first and second pixel regions PA1 and PA2 may have a different area from each other or may have the same area as each other. For example, the first and second pixel regions PA1 and PA2 may have a square shape of an equal area.

Referring to FIG. 8, a driving unit (e.g., 150 of FIG. 7) for driving the first to sixth sub-pixels SP1 to SP6 is formed in the driving region DA.

In FIG. 9, the first electrodes 215a and 215b are formed in the first and second pixel regions PA1 and PA2, respectively, on the substrate 201, and the bank layer 217 is formed on the first electrodes 215a and 215b to cover an edge portion of the first electrodes 215a and 215b.

In addition, first and second organic layers 220a and 220b are formed on the first electrodes 215a and 215b in the first and second pixel regions PA1 and PA2, respectively, and a second electrode 225 is formed on the first and second organic layers 220a and 220b. The first and second organic layers 220a and 220b have first and second thicknesses d1 and d2, respectively, different from each other. In addition, the second electrode 225 is formed on the entire surface of the substrate 201 having the first and second organic layers 220a and 220b.

The OLED display device 200 has a bottom emission type and a light of the first and second organic layers 220a and 220b is emitted through the first electrodes 215a and 215b. As a result, the second electrode 225 may include an opaque metallic material having a relatively thick thickness, and an auxiliary electrode for compensating a sheet resistance is omitted in the OLED display device 200. In another embodiment, however, an auxiliary electrode may be formed in the driving region DA on the substrate 201 to be spaced apart from the first electrodes 215a and 215b for further reducing a sheet resistance.

The first and second electrodes 215a and 225 and the first organic layer 220a between the first and second electrode 215a and 225 in the first pixel region PA1 constitute a first light emitting diode E1, and first and second electrodes 215b and 225 and the second organic layer 220b between the first and second electrode 215b and 225 in the second pixel region PA2 constitute a second light emitting diode E2.

Referring to in FIG. 9, the driving unit (e.g., 150 of FIG. 7) is formed under the bank layer 217 in the driving region DA and is connected to the first electrodes 215a and 215b in the first and second pixel regions PA1 and PA2, respectively.

The first and second organic layers 220a and 220b may be formed through a deposition process or a soluble process including an inkjet printing and a nozzle printing. When the first and second organic layers 220a and 220b are formed through the soluble process, an organic material solution is dropped on the first electrodes 215a and 215b in the first and second pixel regions PA1 and PA2. The dropped organic material solution may be uniformly spread out throughout each of the first and second pixel regions PA1 and PA2 by forming the first and second pixel regions PA1 and PA2 as a square shape of an equal area. As a result, the thickness uniformity of the first and second organic layers 220a and 220b is improved.

Each of the first electrodes 215a and 215b as a transflective electrode transmits a portion of a light generated by the first and second organic layers 220a and 220b and reflects the other portion of the light generated by the first and second organic layers 220a and 220b. The second electrode 225 as a reflective electrode includes a metallic material layer.

The light reflected by the first electrodes 215a and 215b is reflected again by the second electrode 225, and the lights reflected by the first and second electrodes 215a, 215b, and 225 with the same wavelength generate constructive interference (hereinafter referred to as microcavity). As a result, an emission efficiency of the first and second light emitting diodes E1 and E2 is improved.

For generating the microcavity, the first organic layer 220a is formed to have different thicknesses in the first to third sub-pixels SP1 to SP3 as an optical distance to generate the microcavity, and the second organic layer 220b is formed to have different thicknesses in the fourth to sixth sub-pixels SP4 to SP6 as an optical distance to generate the microcavity. For example, a thickness of the hole auxiliary layer between the first electrode 215a or 215b and the red, green and blue emitting material layers EML(R), EML(G) and EML(B) may be sequentially reduced. Accordingly, a thickness of the hole injecting layers HIL or the hole transporting layers HTL under the red, green and blue emitting material layers EML(R), EML(G) and EML(B) may be sequentially reduced.

Specifically, in the OLED display device 200 according to the second embodiment of the present disclosure, the first thickness d1 of the first organic layer 220a in the first to third sub-pixels SP1 to SP3 is different from the second thickness d2 of the second organic layer 220b in the fourth to sixth sub-pixels SP4 to SP6.

For example, one of the first and second organic layers 220a and 20b may have a thickness corresponding to the thickness of the organic layer 20 (of FIG. 3) of the related art, and the other of the first and second organic layers 220a and 220b may have a thickness smaller than the thickness of the organic layer 20 (of FIG. 3) of the related art.

For another example, the first thickness d1 of the first organic layer 220a of the first sub-pixel SP1 may be greater than the second thickness d2 of the second organic layer 220b of the fourth sub-pixel SP4, and the second thickness d2 of the second organic layer 220b of the fourth sub-pixel SP4 may be greater than the first thickness d1 of the first organic layer 220a of the second sub-pixel SP2. The first thickness d1 of the first organic layer 220a of the second sub-pixel SP2 may be greater than the second thickness d2 of the second organic layer 220b of the fifth sub-pixel SP5, and the second thickness d2 of the second organic layer 220b of the fifth sub-pixel SP5 may be greater than the first thickness d1 of the first organic layer 220a of the third sub-pixel SP3. The first thickness d1 of the first organic layer 220a of the third sub-pixel SP3 may be greater than the second thickness d2 of the second organic layer 220b of the sixth sub-pixel SP6.

In addition, one of the first and second organic layers 220a and 220b may include the hole injecting layers HIL or the hole transporting layers HTL having a thickness based on a luminance property of the first and second light emitting diodes E1 and E2, and the other of the first and second organic layers 220a and 220b may include the hole injecting layers HIL or the hole transporting layers HTL having a thickness based on a luminance viewing angle property of the first and second light emitting diodes E1 and E2.

For example, the first light emitting diode E1 may have a luminance property superior to the second light emitting diode E2 such that a luminance along a front direction of the first light emitting diode E1 is greater than a luminance along a front direction of the second light emitting diode E2, and the second light emitting diode E2 may have a luminance viewing angle property superior to the first light emitting diode E1 such that a difference in a luminance or a color difference between front and diagonal directions of the second light emitting diode E2 is smaller than a difference in a luminance or a color difference between front and diagonal directions of the first light emitting diode E1.

In the OLED display device 200 of the second embodiment of the present disclosure, since the first and second organic layers 220a and 220b have a structure for the microcavity, an optical property such as a luminance is improved.

In addition, since a thickness of the hole injecting layer HIL or the hole transporting layer HTL of one of the first and second organic layers 220a and 220b is reduced as compared with the OLED display device 10 (of FIG. 3) according to the related art, a current efficiency (a ratio of an output luminance to an input current: cd/A), a luminance viewing angle property and a color difference (chrominance) property are improved. Further, since a color filter layer for improving the luminance viewing angle is omitted, a fabrication cost is reduced.

FIGS. 10A and 10B are graphs showing a luminance viewing angle property and a color viewing angle property, respectively, of an organic light emitting diode display device according to the first and second embodiments of the present disclosure.

In FIGS. 10A and 10B, first curves 'a' represent a luminance viewing angle property and a color viewing angle property, respectively, of an organic light emitting diode display device without a color filter layer according to the related art, and second curves 'b' represent a luminance viewing angle property and a color viewing angle property, respectively, of an organic light emitting diode display device with a color filter layer according to the related art. In addition, third curves 'c' represent a luminance viewing angle property and a color viewing angle property, respectively, of an organic light emitting diode display device according to the first and second embodiments of the present disclosure.

In FIG. 10A, the luminance viewing angle property 'c' of the OLED display device according to the first and second embodiments of the present disclosure is improved to have a better uniformity as compared with the luminance viewing angle properties 'a' and 'b' of the OLED display device according to the related art.

In FIG. 10B, the color viewing angle property 'c' of the OLED display device according to the first and second embodiments of the present disclosure is improved as compared with the color viewing angle property 'a' of the OLED display device according to the related art to have a similar uniformity to the color viewing angle property 'b' of the OLED display device according to the related art.

Consequently, in an organic light emitting diode (OLED) display device according to the present disclosure, since the first and second organic layers have a structure for a microcavity, an optical property such as a luminance is improved.

In addition, since a thickness of one of the first and second organic layers is reduced as compared with the OLED display device according to the related art, a current efficiency, a luminance viewing angle property and a color difference (chrominance) property are improved.

Further, since a color filter layer for improving the luminance viewing angle is omitted, a fabrication cost is reduced.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An organic light emitting diode display device, comprising:
   a substrate having first and second pixel regions and a driving region between the first and second pixel regions;
   first electrodes in the first and second pixel regions, respectively, on the substrate, the first electrodes being spaced apart from each other;
   a driving unit in the driving region;
   first and second organic layers on the first electrodes disposed in the first and second pixel regions, respectively, the first and second organic layers having a different thickness from each other and displaying a same color; and
   a second electrode on the first and second organic layers.

2. The display device of claim 1, further comprising:
   an auxiliary electrode disposed in the driving region on the substrate; and
   a bank layer disposed in the first and second pixel regions and the driving region on the substrate, the bank layer covering edge portions of the first electrodes,
   wherein the auxiliary electrode is spaced apart from the first electrodes,
   wherein the bank layer is disposed on the auxiliary electrode and has an opening exposing the auxiliary electrode, and
   wherein the second electrode is connected to the auxiliary electrode through the opening.

3. The display device of claim 1, wherein each of the first electrodes includes first and second transparent conductive material layers and a reflective layer between the first and second transparent conductive material layers, and
   wherein the second electrode is transflective.

4. The display device of claim 3, wherein the first electrodes have thicknesses corresponding to a microcavity.

5. The display device of claim 4, wherein the second transparent conductive material layer on the reflective layer in the first pixel region has a different thickness from the second transparent conductive material layer on the reflective layer in the second pixel region.

6. The display device of claim 1, wherein the driving unit is connected to the first electrodes through first and second driving lines, respectively, and
   wherein the first and second driving lines have at least one of different lengths and different widths from each other.

7. The display device of claim 1, wherein the driving unit includes first and second driving units,
wherein the first driving unit is connected to the first electrode in the first pixel region through a first driving line, and the second driving unit is connected to the first electrode in the second pixel region through a second driving line, and
wherein the first and second driving lines have at least one of different lengths and different widths from each other.

8. The display device of claim 1, wherein the first electrode, the first organic layer and the second electrode in the first pixel region constitute a first light emitting diode, and the first electrode, the second organic layer and the second electrode in the second pixel region constitute a second light emitting diode,
wherein a luminance along a front direction of the first light emitting diode is greater than a luminance along the front direction of the second light emitting diode, and
wherein a difference in one of a luminance and a color difference between front and diagonal directions of the second light emitting diode is smaller than a difference in one of a luminance and a color difference between front and diagonal directions of the first light emitting diode.

9. The display device of claim 1, wherein the first and second organic layers have thicknesses corresponding to a microcavity.

10. The display device of claim 9, wherein each of the first and second organic layers includes a hole auxiliary layer, and
wherein the hole auxiliary layer of the first organic layer has a different thickness from the hole auxiliary layer of the second organic layer.

11. The display device of claim 10, wherein the hole auxiliary layer of each of the first and second organic layers includes a hole injecting layer and a hole transporting layer, and
wherein one of the hole injecting layer and the hole transporting layer of the first organic layer has a different thickness from one of the hole injecting layer and the hole transporting layer of the second organic layer.

12. The display device of claim 11, wherein one of the first and second organic layers includes the hole injecting layer or the hole transporting layer having a thickness based on a luminance, and the other of the first and second organic layers includes the hole injecting layer or the hole transporting layer having a thickness based on a luminance or a color viewing angle.

13. The display device of claim 12, wherein the first and second organic layers are formed through a soluble process.

14. The display device of claim 1, wherein the first and second pixel regions have a same area as each other.

15. The display device of claim 1, wherein the first electrodes are transflective, and
wherein the second electrode includes a metallic material layer.

16. The display device of claim 1, wherein the driving unit is connected to the first electrodes, and wherein the first and second pixel regions are driven according to a same data signal by the driving unit.

17. The display device of claim 16, wherein the same data signal is applied to the first and second organic layers by a same driving unit between the first and second pixel regions.

18. The display device of claim 1, wherein the first pixel region includes first to third sub-pixels and the second pixel region includes fourth to sixth sub-pixels,
wherein the first and fourth sub-pixels display a same color, the second and fifth sub-pixels display a same color, and the third and sixth sub-pixels display a same color, and
wherein the first to sixth sub-pixels constitute a unit pixel for displaying a white color.

19. The display device of claim 18, wherein the first, second and third sub-pixels display red, green and blue colors, respectively.

20. The display device of claim 18, wherein a thickness of the first organic layer of the first sub-pixel is greater than a thickness of the second organic layer of the fourth sub-pixel, the thickness of the second organic layer of the fourth sub-pixel is greater than a thickness of the first organic layer of the second sub-pixel, the thickness of the first organic layer of the second sub-pixel is greater than a thickness of the second organic layer of the fifth sub-pixel, the thickness of the second organic layer of the fifth sub-pixel is greater than a thickness of the first organic layer of the third sub-pixel, and the thickness of the first organic layer of the third sub-pixel is greater than a thickness of the second organic layer of the sixth sub-pixel.

* * * * *